United States Patent [19]
Berry, Jr. et al.

[11] Patent Number: 5,278,842
[45] Date of Patent: Jan. 11, 1994

[54] DELAY TEST COVERAGE ENHANCEMENT FOR LOGIC CIRCUITRY EMPLOYING LEVEL SENSITIVE SCAN DESIGN

[75] Inventors: Robert W. Berry, Jr., Stanfordville; Jacob Savir, Mahopac, both of N.Y.

[73] Assignee: International Business Machines Corporation, Armonk, N.Y.

[21] Appl. No.: 650,387

[22] Filed: Feb. 4, 1991

[51] Int. Cl.$^5$ ............................................. H04B 17/00
[52] U.S. Cl. .................................. 371/22.3; 371/22.1
[58] Field of Search ..................... 371/22.3, 22.1, 22.6, 371/21.3, 27

[56] References Cited
U.S. PATENT DOCUMENTS

| | | | |
|---|---|---|---|
| 4,736,375 | 4/1988 | Tannhäuser et al. | 371/27 |
| 4,764,926 | 8/1988 | Knight et al. | 371/27 |
| 4,802,133 | 1/1989 | Kanuma et al. | 371/22.6 |
| 4,860,290 | 8/1989 | Daniels et al. | 371/22.3 |
| 4,942,577 | 7/1990 | Ozaki | 371/22.3 |

FOREIGN PATENT DOCUMENTS
0164209 4/1985 United Kingdom.

OTHER PUBLICATIONS

IBM Technical Disclosure Bulletin, Delay Testing & Diagnosis of LSSD Shift Register Strings vol. 20 Nol. 1 (Jun. 1977) pp. 307–312.

IBM Technical Disclosure Bulletin, Bit-Pushing Approach to VLSI Circuit Self-Testing vol. 28, No. 2 (Jul. 1985) pp. 676–679.

IBM Technical Disclosure Bulletin, Shift Register Latch for Delay Testing vol. 32 No. 4A (Sep. 1989) pp. 231–232.

"Review of Built-in Test Methodologies for gale arrays" by K. A. E. Totten, IEEE Proceedings, vol. 132, Pts E & I, No. 2, Mar./Apr. 1985 pp. 121–129.

"Automated BIST for Sequential Logic Synthesis" by Charles E. Stroud, IEEE Design & Test of Computers, Dec. 1988, No. 6 pp. 22–32.

Primary Examiner—Robert W. Beausoliel, Jr.
Assistant Examiner—Phung Chung
Attorney, Agent, or Firm—Lawrence D. Cutter

[57] ABSTRACT

By selectively associating output signal lines with logic circuit input signal lines, it is possible to produce a combination logic circuit and latch string in which no pair of adjacent latches is connected to the same cone of logic in the logic circuit. This provides greatly improved capabilities for delay or AC circuit test with respect to the independence of test pairs of excitation data. The objective may also be achieved in whole or in part through the use of dummy latch elements which do not feed any logic circuit input signal lines.

4 Claims, 13 Drawing Sheets

| ORDERED LIST OF INPUT/OUTPUT DEPENDENCIES FOR FIG.2A ||
|---|---|
| INPUT NO. | FEEDS OUTPUT NO. |
| 2 | 1,3 |
| 3 | 1,3 |
| 4 | 1,2 |
| 5 | 1,2 |
| 1 | 1 |
| 6 | 2 |
| 7 | 2 |
| 8 | 3 |

| ORDERED LIST OF INPUT/OUTPUT DEPENDENCIES FOR FIG.3A ||
|---|---|
| INPUT NO. | FEEDS OUTPUT NOS. |
| 1 | 1,2,3 |
| 2 | 1,2,3 |
| 3 | 1,2,3 |
| 4 | 1,2 |
| 5 | 1,3 |
| 6 | 2,3 |
| 7 | 2,3 |
| 8 | 1 |
| 9 | 1 |
| 10 | 2 |
| 11 | 2 |
| 12 | 3 |
| 13 | 3 |

FIG.3D

| SRL NO. | ASSIGNED TO INPUT NO. | FEEDS OUTPUT NOS. |
|---|---|---|
| 1 | 1 | 1,2,3 |
| 2 | DUMMY(OR OUTPUT LATCH) | NONE |
| 3 | 2 | 1,2,3 |
| 4 | DUMMY(OR OUTPUT LATCH) | NONE |
| 5 | 3 | 1,2,3 |
| 6 | DUMMY(OR OUTPUT LATCH) | NONE |
| 7 | 6 | 2,3 |
| 8 | 8 | 1 |
| 9 | 7 | 2,3 |
| 10 | 9 | 1 |
| 11 | 10 | 2 |
| 12 | 5 | 1,3 |
| 13 | 11 | 2 |
| 14 | 12 | 3 |
| 15 | 4 | 1,2 |
| 16 | 13 | 3 |

SRL ASSIGNMENT LIST

DELAY TEST COVERAGE ENHANCEMENT FOR LOGIC CIRCUITRY EMPLOYING LEVEL SENSITIVE SCAN DESIGN

BACKGROUND OF THE INVENTION

The present invention is generally directed to the testing of complex logic circuits using randomly generated signal patterns. More particularly, the present invention is directed to a method for distributing the output signal lines from a shift register latch string amongst the inputs to a logic circuit so as to improve test coverage and flexibility. Even more particularly, the invention is directed to level sensitive scan design (LSSD) methodologies for test circuit design.

As integrated circuit chip devices have become more densely packed with electronic components and more complex, the need for testing such circuits has grown significantly. This is especially true of digital logic circuits. In order to provide a mechanism for testing complex circuitry of this type, a number of built-in self test (BIST) methodologies have been employed including level sensitive scan design techniques. In the LSSD methodology, a long string of shift register latches is employed in a dual function role which does not detract from normal circuit operation. In particular, the shift register latch string provides both normal input during circuit operation and also provides a mechanism for providing test input signals to the circuit for diagnostic purposes. These tests may be employed immediately subsequent to chip manufacture or may in fact be employed in the field to diagnose error conditions. Depending on the source of input signals to the shift register latch scan string, either normal operations or test operations may be carried out.

Because of the usually large number of input signal lines and the combinatorially large number of possible inputs to these signal lines, random test pattern generation is generally employed to insure complete and uniform coverage of all important test conditions that could arise. The present invention is particularly directed to so-called AC or delay testing of the logic circuit. In this particular form of test, it is important to provide two distinct sets of signal values to the logic circuit at closely spaced time intervals so as to best ascertain whether or not a fault condition exists. With current approaches to this problem, where one test pattern follows closely after another, the test pairs are very highly correlated and thus are limited in the number of different pairs of test patterns which can be applied.

One of the concepts that is important to grasp for an understanding of the present invention, is the notion of a "cone of logic". In any given logic circuit, there are input and output signal lines. Not every input line can generally influence every output signal line. Conversely, each output signal line is generally influencable only by a subset of input signal lines. Thus, each output signal line is associated with a cone of logic representing signal paths through which input signals influence the output signal. Furthermore, it is seen that an input signal line can in fact influence the output at more than one output signal line. Thus, one can associate with each output signal line a subset of input signal lines passing through and defining the cone of logic. Concomitantly, one can associate with each input signal line a subset of output signal lines which can be influenced by the input signal present on any selected input signal line.

SUMMARY OF THE INVENTION

In accordance with a preferred embodiment of the present invention, a logic circuit with input and output signal lines is used in conjunction with a chain of shift register latches providing input test signals to the logic circuits wherein (in its optimal embodiment) no two adjacent latches provide signals to the same cone of logic. In other words, the chain of shift register latches provides input signals to the logic circuit so that a number of adjacent latches provide signals to different cones of logic. As long as no two adjacent signal lines from the latch scan string feed the same cone of logic, the number of pairs of patterns that can be generated is increased by a factor of approximately $2^n$, wherein n is the number of inputs to the particular cone of logic being considered.

Accordingly, it is an object of the present invention to improve AC or delay testing of logic circuits.

It is also an object of the present invention to render level sensitive scan design methodologies more effective.

It is yet another object of the present invention to increase the number of possible pairs of patterns that are supplied in sequence to one or more cones of logic which comprise a logic circuit.

It is a still further object of the present invention to provide a method for assigning shift register output signal lines to various logic circuit input signal lines in a manner which generally insures that adjacent shift register latches do not feed the same cone of logic.

Finally, but not limited hereto, it is an object of the present invention to provide more thorough testing of logic circuits.

DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

DETAILED DESCRIPTION OF THE INVENTION

Figure 1A:
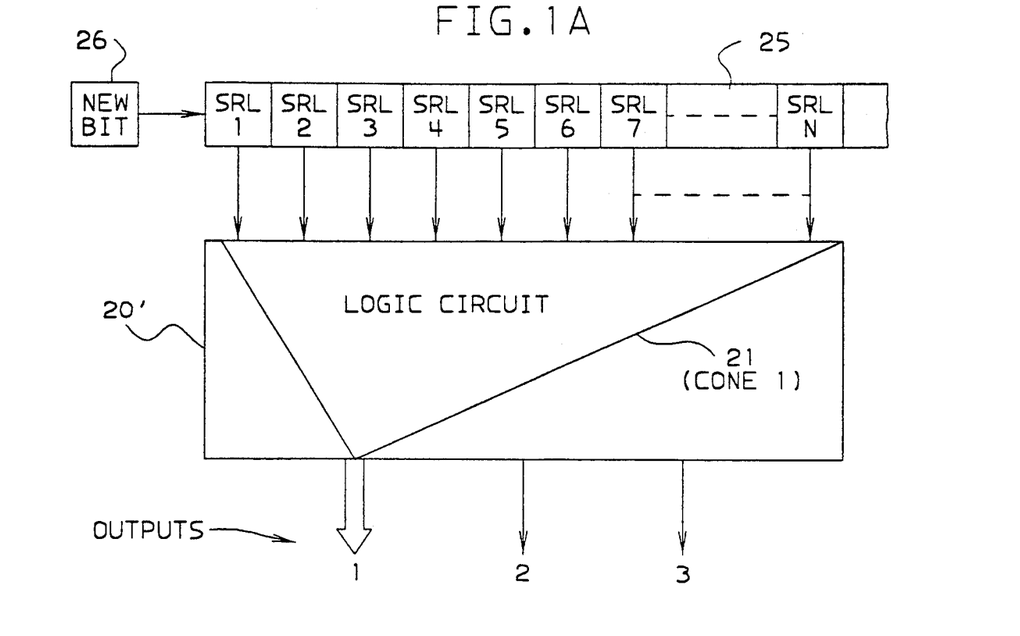
FIG. 1A is a logical block diagram illustrating the problem solved by the present invention.

FIG. 1A illustrates the problem solved by the present invention. In particular, there is shown therein logic circuit 20' having three output signal lines labeled 1, 2 and 3, as shown. Logic circuit 20' may include standard combinatorial logic elements and additionally may also include memory elements such as flip-flops, registers and latches. In particular, there is illustrated cone of logic 21 (cone 1) which includes (in a schematic fashion) all of the circuitry and input signal lines which can influence output 1. Similar cones of logic could be shown for outputs 2 and 3, but it is sufficient for the present discussion to consider only the input to logic cone 21.

In general it should be understood that as used herein, the term "input" can refer either to a primary input to the device, or to the output of a shift register latch embedded in the device. Likewise, the term "output" can refer either to a primary output from the device, or to the input of a shift register latch embedded in the device.

In accordance with LSSD methodology, this logic cone may be provided with input signals from shift register latch scan string 25. In this instance, shift register latches 1 through n possess output signal lines which supply logic cone 21 and thus there are n such signal lines which can influence output 1. Other shift register latch elements are directed to the other cones of logic in circuit 20' which is thus supplied with input signal lines from the remaining portion of scan string 25 (not shown). Additionally of note is the fact that scan string outputs from latches 1 through n may also feed other cones of logic beside cone 21.

The particular feature to note in FIG. 1A, is that, except in the case of shift register latch 1 and shift register latch n, each shift register latch is adjacent to a shift register latch which also supplies input signals to logic cone 21. This arrangement produces undesirable and significant limitations. Generally, shift register latch scan string 25 is used to provide normal operating signals to logic circuit 20'. Nonetheless, it should also be appreciated that during times of test (the times of relevance herein), shift register latch scan string 25 provides test signals to logic circuit 20'.

During test phases, a pattern is shifted into scan string 25 and used to drive the logic circuit for test purposes. In this case, input patterns are fed into the scan string in a serial fashion with bit patterns being shifted from the left to the right (for example) in FIG. 1A. It should also be appreciated that the present invention is directed to the particular situation in which AC or delay tests are being performed on the logic circuit 20'. In these circumstances, it is desirable to *rapidly* apply two *different* input signal patterns to observe the timing behavior of circuit 20'. It is not practical to wait until a whole new pattern is shifted into the n positions of scan string 25. Nonetheless, it is desirable that the patterns which are applied to logic circuit 20' are as statistically uncorrelated as possible.

This result is not easily achievable with the circuit shown in FIG. 1A. In particular in this circuit, bits are shifted to the right and the new bit from latch 26, which is shifted into shift register latch 1, can either be a 0 or a 1. That provides a very limited range of possibilities. Not only is the range of possibilities limited, but the fact is that the second pattern of the pattern pair which is applied is merely a shifted version of the previous pattern. Accordingly, a lot of the test advantages achieved by randomization of the input patterns is lost. Subsequent pairs of patterns which are applied for AC test measurements become highly correlated and the robustness of the tests decline.

Figure 1B:
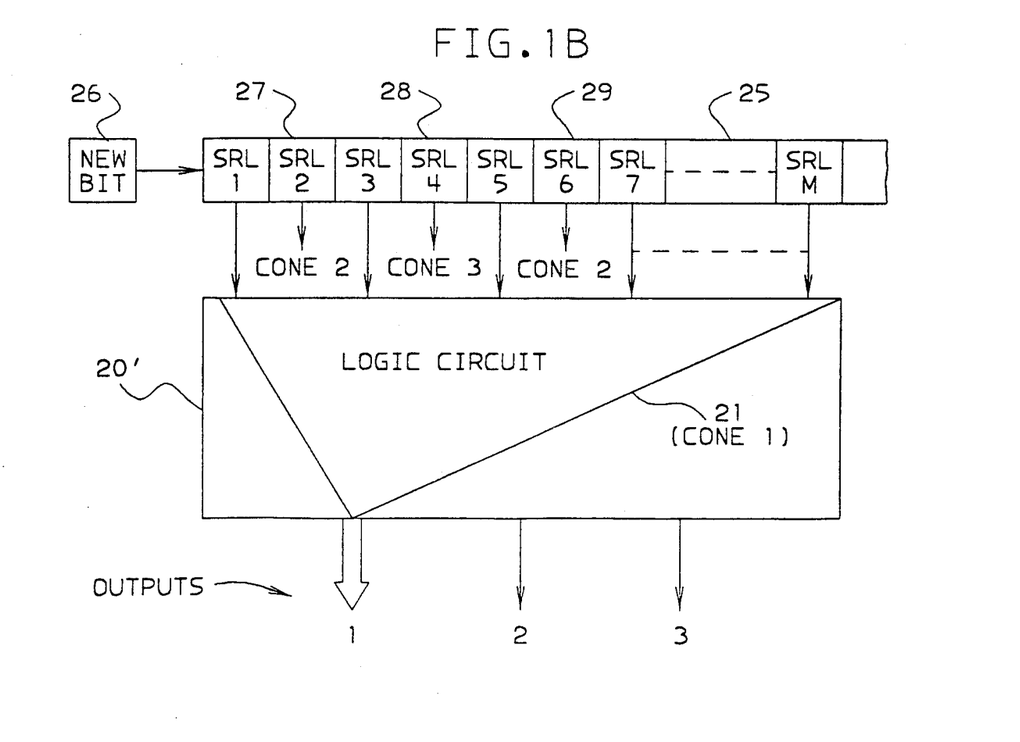
FIG. 1B is similar to FIG. 1A but indicating in a general sense the practice of the present invention in which adjacent shift register latch output signals are not supplied to the same cone of logic.

A modified distribution of shift register latch output signal line assignments is shown schematically in FIG. 1B. In particular, it is noted in FIG. 1B that the output signal lines from shift register latches 2, 4 and 6 (SRL reference numerals 27, 28 and 29 respectively) are no longer directed to logic cone 21 but instead are directed to various other cones of logic such as cone 2 (not shown) and cone 3 (not shown). There will still be the same number of input lines supplied to logic cone 21, but in general they will come from shift register latches farther to the right in scan string 25. It is also noted that the last shift register latch to provide an input signal line to logic cone 21 in FIG. 1B is designated as shift register latch m and clearly $m > n$ where these integers denote shift register latch position within scan string 25.

Thus in FIG. 1A, a cone of logic having n input signal lines can only be fed with a maximum of $2^{n+1}$ pairs of patterns during AC testing. This is a very small number compared to the global maximum of $2^n(2^n-1)$ pattern pairs which is achievable in the absence of the adjacent bit dependency which is evident in FIG. 1A. In accordance with an optimal embodiment of the present invention, in order to enhance the AC test capability, input signal lines to the logic circuit are assigned to shift register latches such that no two input signal lines belonging to the same cone of logic are supplied from adjacent latches in the scan string. This overcomes the aforementioned dependency and allows AC tests to maintain their full potential.

One mechanism for achieving this goal, is by adding a dummy shift register latch between every two shift register latches and using every other shift register latch to feed the logic. This however is not a preferred solution since it is inefficient and not cost effective, but yet is one that is nonetheless in keeping with the approach of the present invention which seeks to increase AC testing flexibility.

In terms of pairs of patterns, the circuit of FIG. 1A can be excited initially by one of $2^n$ patterns. However upon second subsequent application, the number of possibilities for new bits to be shifted in is limited to only two (that is, a zero or one from latch 26). Thus in terms of the number of pairs of patterns, there are $2 \times 2^n$ or $2^{n+1}$ possible pairs as indicated above. However, for the circuit shown in FIG. 1B, the first circuit stimulation can be carried out with $2^n$ different patterns. However, because there is an independently definable shift register latch (in terms of contents) between each of the latches which feed logic cone 21, there are also $2^n$ different possible test patterns for the second circuit stimulus. However, discounting the fact that one does not want to repeat the same pattern, one subtracts one from this number so that the actual number of desirable resulting pattern pairs, which may be provided to the circuit of FIG. 1B, is, as indicated above, $2^n(2^n-1)$. It remains to be seen however below how this assignment may be made since it is a non-trivial problem. However, an algorithm for providing an improved assignment or distribution of signal lines so as to match up logic circuit inputs and shift register latch scan string outputs is provided below in conjunction with the circuit shown in FIG. 2A.

Figure 2A:
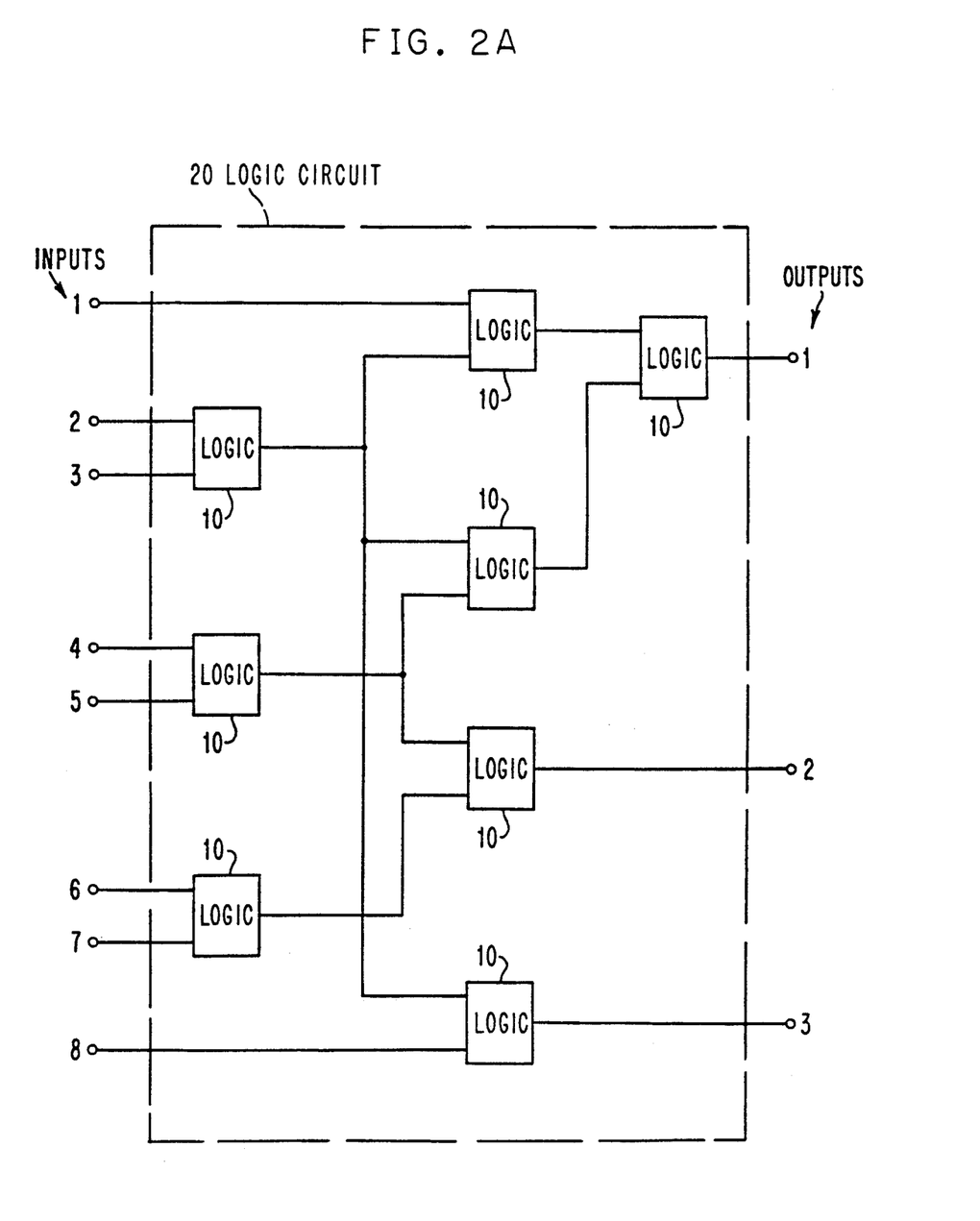
FIG. 2A is a schematic diagram illustrating a simple exemplary logic circuit for purposes of discussion herein.

Thus, consideration is now directed to FIG. 2A in which a logic circuit 20, having eight input signal lines and three output signal lines, is shown. In this particular case, logic circuit 20 comprises eight subcircuits which may represent individual AND, OR or NOT gates or may in fact may represent more complicated combinatorial and/or sequential circuits 10. This circuit is shown for the purpose of providing an example of the selection distribution method and the circuit that results therefrom connecting shift register latch scan string output lines with the circuit input signal lines.

Figure 2B:
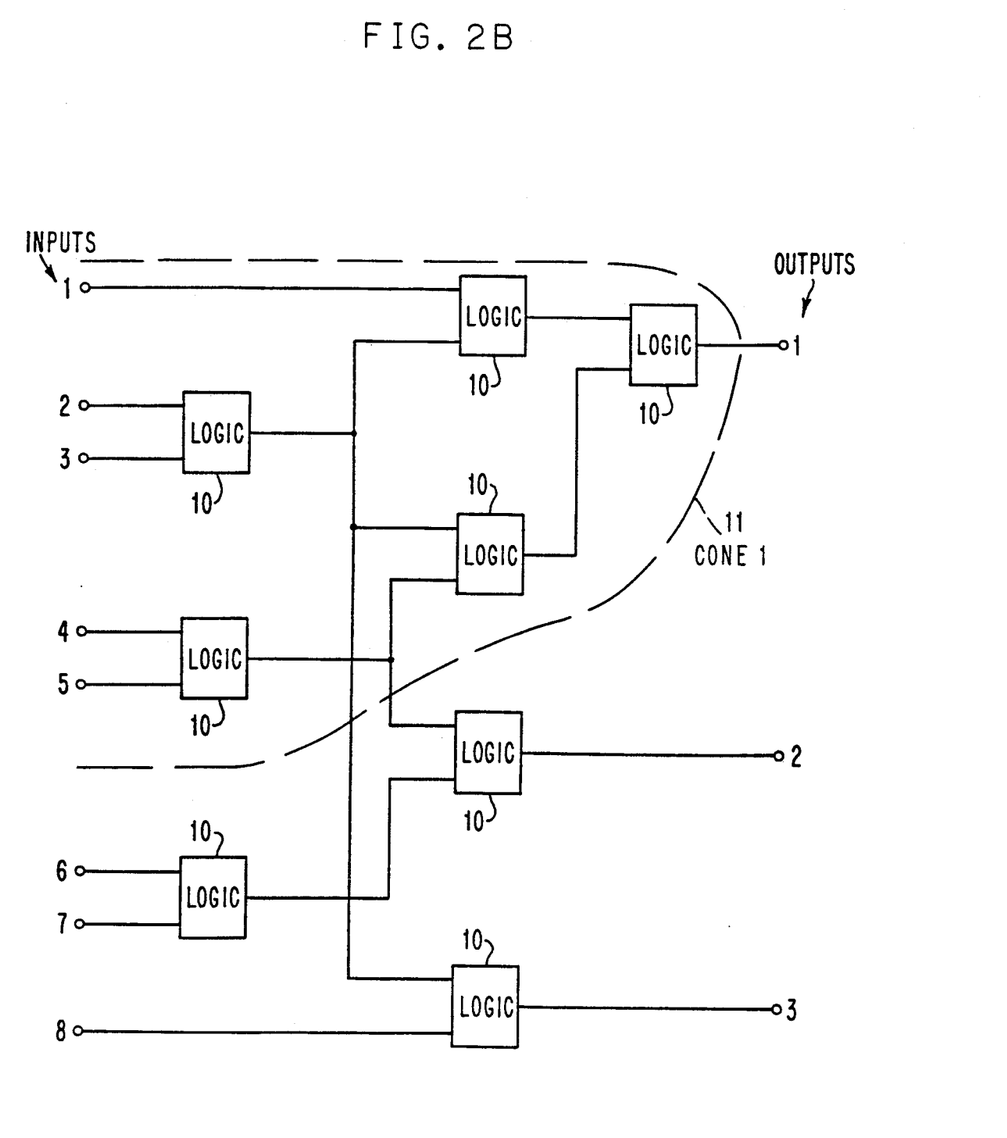
FIGS. 2B through 2D are similar to FIG. 2A but more particularly indicate each of the three cones of logic associated with the output signal lines in FIG. 2A.
Figure 2C:
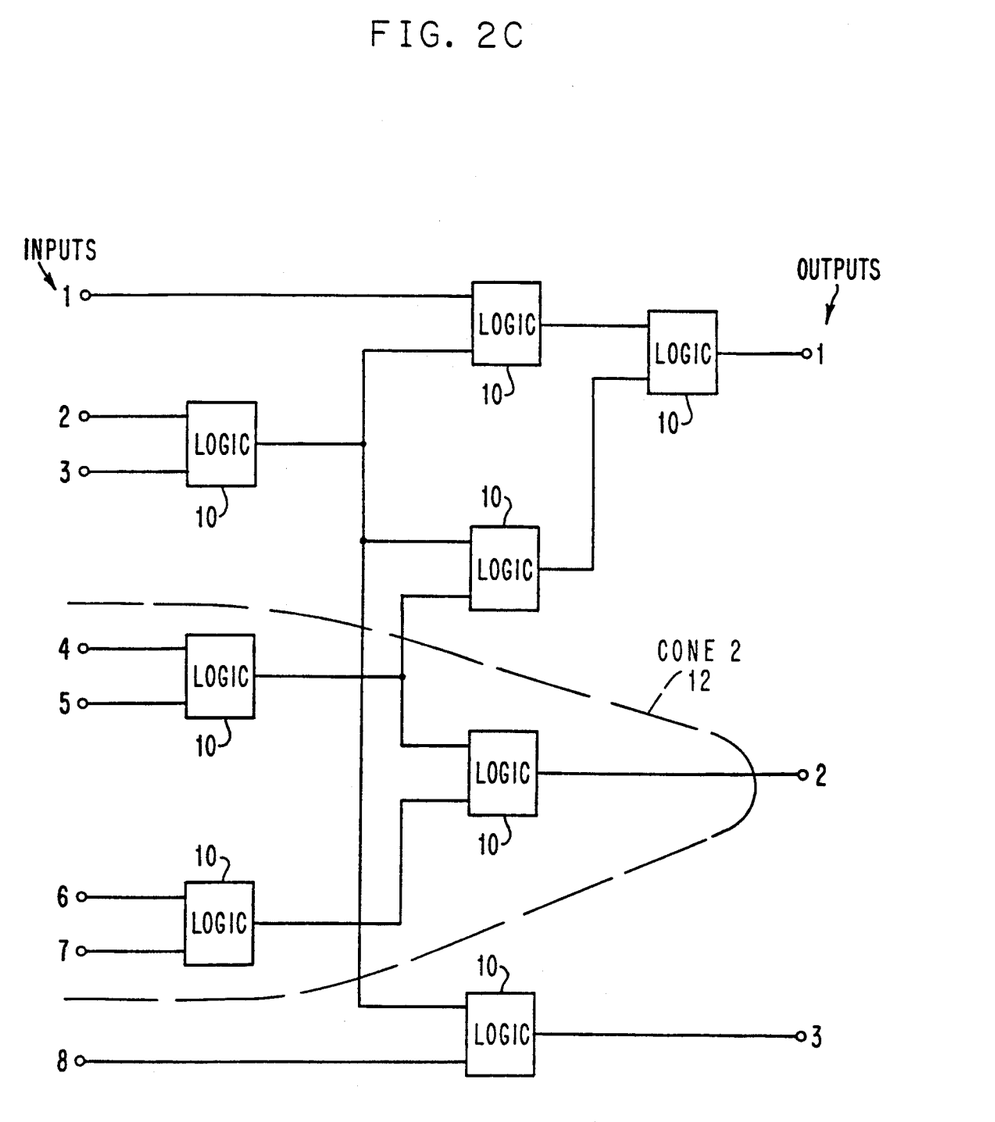
Figure 2D:
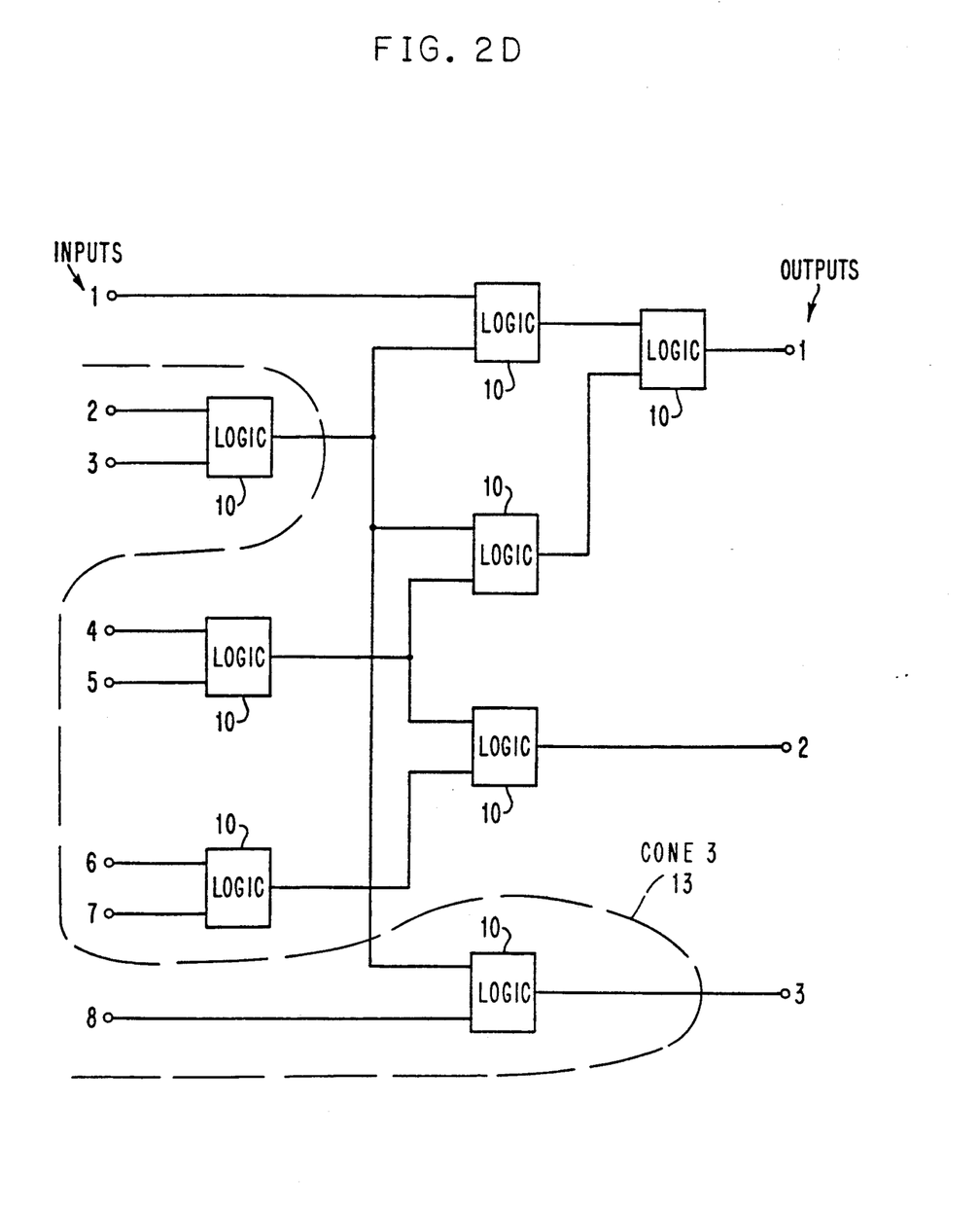

FIGS. 2B through 2D illustrate the three cones of logic which are associated with output lines 1, 2 and 3 respectively in FIG. 2A. In particular, FIG. 2B illustrates the cone of logic for output signal line 1 which includes the five logic subcircuits shown together with input lines 1, 2, 3, 4 and 5. In a similar fashion, FIG. 2C illustrates the cone of logic for output signal line 2. This cone includes the three logic subcircuits shown and the input signal lines 4, 5, 6 and 7. Likewise, FIG. 2D illustrates the cone of logic for output 3 signal line which includes only two logic subcircuits and input signal lines 2, 3 and 8. Thus, for example no input signal other than signals appearing on lines 2, 3 or 8 can influence output signal line 3. This is the essential meaning behind the term "cone of logic".

Figure 2E:
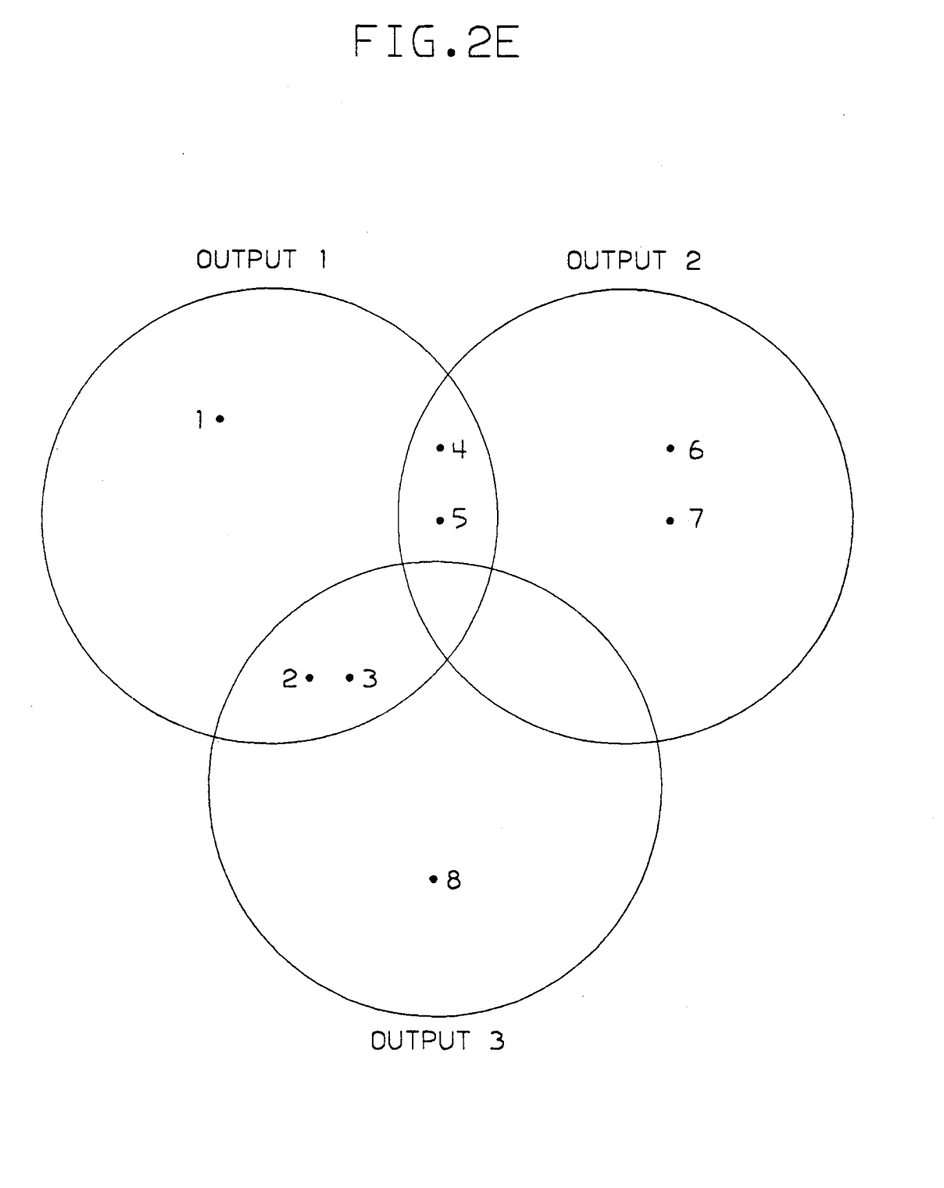
FIG. 2E is a Venn diagram illustrating the overlap between input signal lines and the three cones of logic associated with the three output signal lines of FIG. 2A.

FIG. 2E is a Venn diagram summarizing the overlap that exists between the three cones of logic associated with FIG. 2A. In particular, it is seen that input signal line 1 can only influence output signal line 1. However, input signal lines 2 and 3 can influence output signals appearing on output signal line 1 and output signal line 3. Input signal lines 4 and 5 likewise impact only the cones of logic associated with output signal lines 1 and 2. Signal lines 6 and 7 only influence output signal line 2. Lastly, input signal line 8 is only capable of influencing the output signal associated with the cone of logic for output signal line 3. In the particular instance shown in FIGS. 2A and 2E, there is no input signal line which has an influence on the output signal for all three cones of logic. Thus, it is seen that there is both overlap and independence associated with the input signal lines and the output cones of logic which they influence.

Figure 2F:
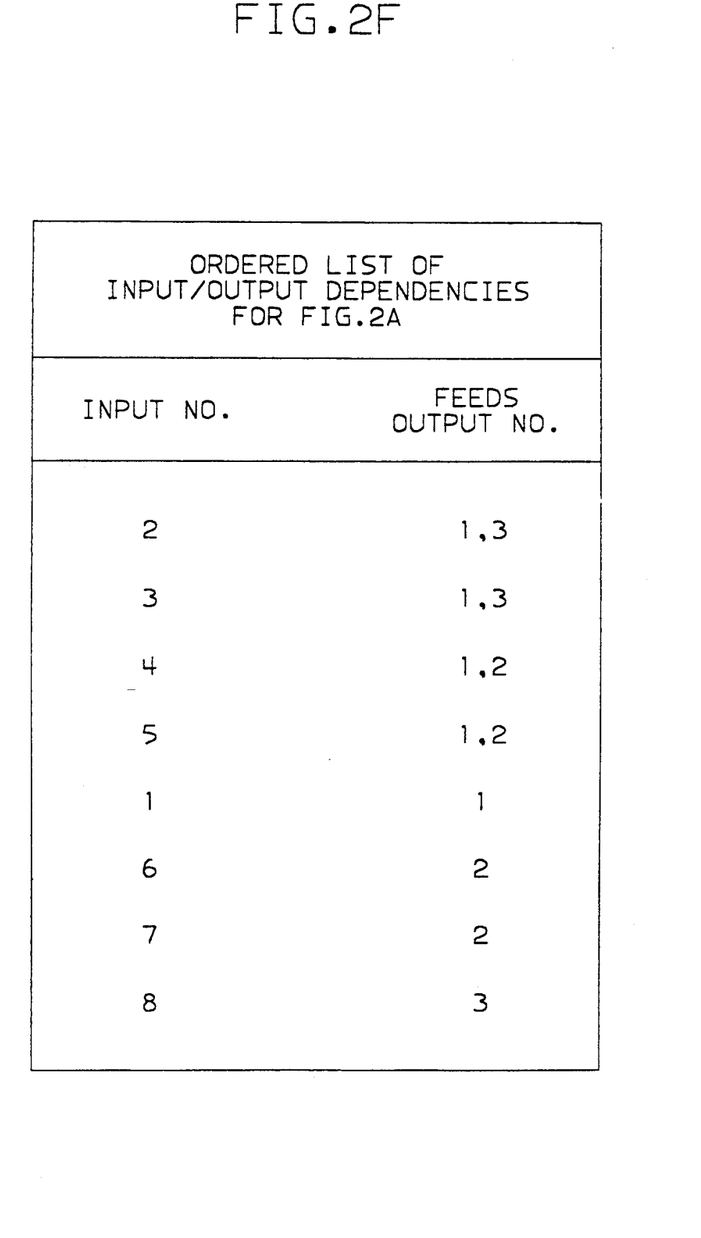
FIG. 2F is an ordered list of input/output associations for the circuit shown in FIG. 2A.

If the output signal lines from shift register latch scan string 25 are provided to a logic circuit a linear, uninterrupted fashion as shown in FIG. 1A, it is seen that the desired test coverage, as discussed above, is not achieved. It is therefore desirable to insure that adjacent shift register latch output signal lines are supplied to different cones of logic. A method for providing a desired distribution of scan string output signal lines is now provided. One way of achieving the desired distribution or assignment is by adding one or more dummy shift register latches between any two shift register latches and using every other shift register latch in the chain to feed the logic. Although this solution is possible, there are yet other procedures which may be applied and which are also in keeping with the present invention. In particular, a cost effective assignment of shift register latches output signal lines to the logic input signal lines may be achieved with very little overhead with the utilization of the following 3 step procedure:

Step 1: For every input signal line to the logic circuit that needs to be assigned to a shift register latch, a listing is made of the input signal lines that feed (directly or indirectly) various cones of logic. That is, a list is established wherein the first column is a list of input signal line numbers and in the second column there is a list of the cones of logic with which it is associated. Clearly such a list is easily constructed from the kinds of information present in FIG. 1A or FIG. 2E. The list of input signal lines is ordered so that those signal lines feeding a greater number of cones of logic appear closer to the top of the list than those signal lines feeding fewer cones of logic. Such a list is shown in FIG. 2F. In particular, FIG. 2F corresponds to the logic circuit shown in FIG. 2A.

Step 2: For the list generated in Step 1 (FIG. 2F, for example), determine if there are any input signal lines which feed all cones of logic. If there are any such inputs, it is necessary to assign them to alternate SRLs with dummy latches inserted in between. However, it is noted that some of these dummy latches can be employed to a certain degree as shift register latches for holding output signal data. For the situation shown in FIG. 2A it is seen that there is no input signal line which feeds all three cones of logic. If there is, it is seen that this actually represents a worst case situation. However, this is generally not the case and there is in fact significant room for improvement as seen below in considering the next step employed.

Step 3: The list of ordered input numbers and corresponding cones of logic is scanned from top to bottom. The next shift register latch in the scan path is assigned to an input that does not feed any of the output cones of logic already fed by the previously assigned output. This input is marked as being already assigned. If no such inputs exist, and not all inputs have already been marked, again, a dummy shift register latch is added and Step 3 is repeated.

Figure 2G:
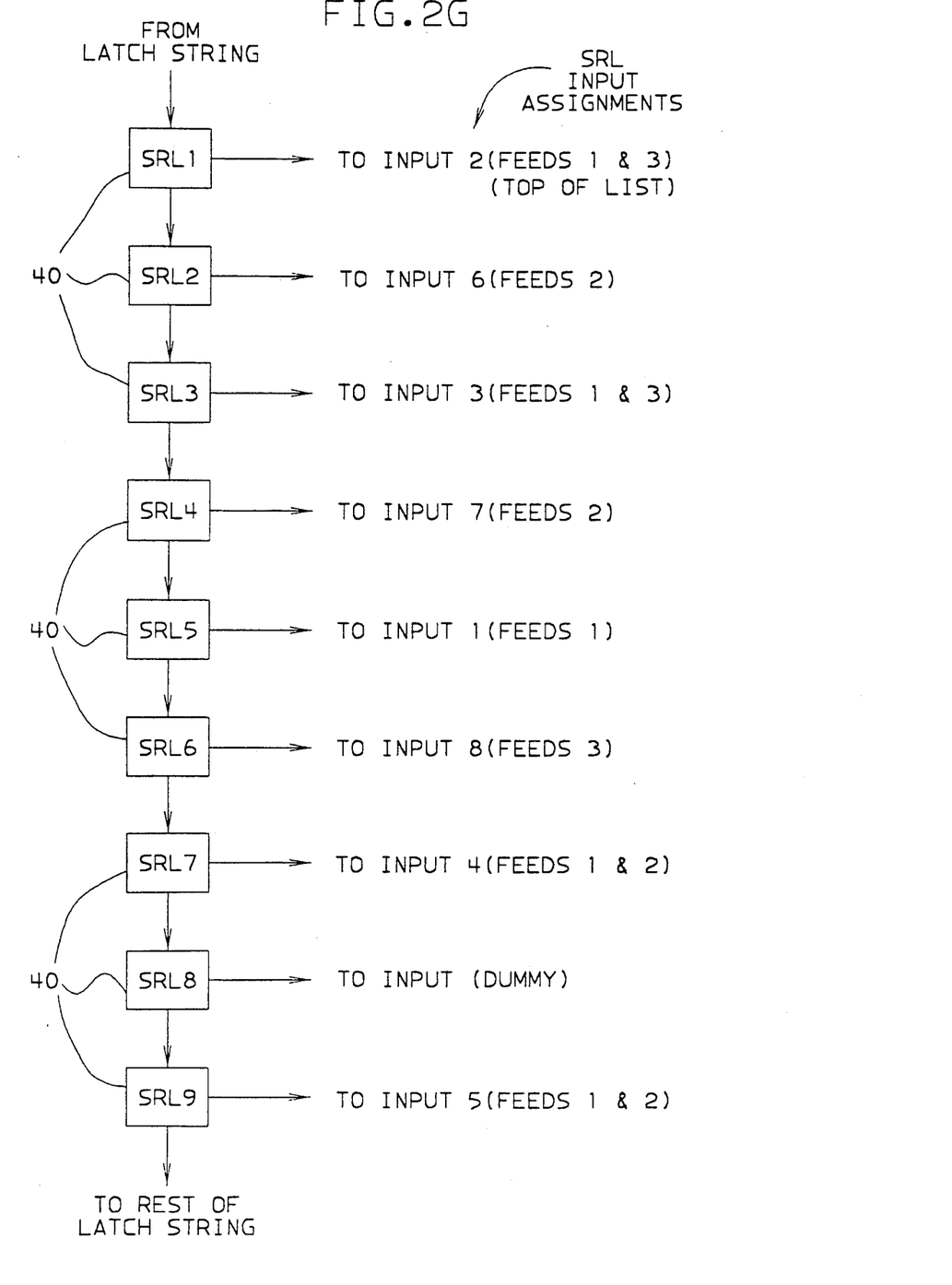
FIG. 2G illustrates a distribution of shift register latch output signal line assignments to logic circuit input signal lines made in accordance with the present invention.

In this way, a complete assignment is made after a certain number of iterations of Step 3. The application of this algorithm to the circuit shown in FIG. 2A results in the shift register latch scan string assignment shown in FIG. 2G. In particular, FIG. 2G shows shift register latches 40 arranged as a portion of scan string 25 and labeled as shift register latches 1 through 9. Shift register latch 1 is assigned to input 2 which feeds output signal lines 1 and 3.

Accordingly, it is necessary to assign shift register latch 2 to a different cone of logic, the only available cone being cone 2. The first input signal line in the list from FIG. 2F which feeds cone 2 but not cones 1 or 3 is input signal line 6. Thus, shift register latch 2 is assigned to input 6.

Next, shift register latch 3 must be assigned to a cone of logic other than cone 2 (since shift register latch 2, the previous latch in the string, already feeds logic cone 2). As the input signal line assignments are made, the corresponding row in FIG. 2F is marked as already having been assigned. Continuing with respect to shift register latch 3, it is seen that the first input number in the list, which is not marked (used, assigned) and which does not feed logic cone 2, is input signal line 3 which feeds logic cones 1 and 3. Accordingly, this assignment is now made.

Next, with respect to shift register latch 4 in FIG. 2G, it is seen that it is necessary to find an input signal line in the list which does not feed logic cones 1 or 3 (because of the assignment made for shift register latch 3, the prior latch). Again, the first non-marked item in the list from FIG. 2F which satisfies this requirement is input signal line 7 which feeds only logic cone 2. Accordingly, shift register latch 4 is therefore assigned to input signal line 7.

Next is considered the assignment for shift register latch 5 which must be assigned to an input signal line which does not feed cone 2, and which has not already been checked. The first (and only this time) assignment from the list which is now possible, is input signal line 1 which feeds only logic cone 1. Accordingly, shift register latch 5 is assigned to input signal line 1.

Next is considered the assignment for shift register latch 6. Because the previous shift register latch, latch 5, fed logic cone 1, it is necessary for shift register latch 6 to be assigned to an input signal line which feeds a different logic cone, say cone 2 or cone 3 but not 1. Here it is seen that the possible choice for an unmarked item includes input signal lines which do feed not only logic cone 2 but which do not feed logic cone 1; this list includes only input signal line 8. The only viable choice for the assignment for shift register latch 6 is input signal line 8 which feeds only logic cone 3. Accordingly, shift register latch 6 is assigned to input signal line 8.

Next is considered the assignment for shift register latch 7. This input signal line is constrained to feed a logic cone other than logic cone 3 which is fed by the previous shift register latch (latch 6). The first item in the list which satisfies this requirement is input signal line 4. However, it is noted that signal line 5 is also associated with the same cones of logic as signal line 4 and accordingly, it would also have been possible to take input signal line 5 as the selection of choice. In short, it is not always necessary to choose the first item in the list which satisfies the requirement, although this is usually done for convenience.

With respect to shift register latch 8, it is noted that this shift register latch ought to be assigned to an input signal line which feeds logic cone 3 since the prior latch feeds cones 1 and 2. The only candidates for feeding logic cone 3 are input signal lines 2, 3 and 8. However, these assignments have already been made and the only unmarked or unassigned item in the list is item 5, that is, input signal line 5. Accordingly, at this step it is necessary to add a dummy shift register latch which does not supply signals to any one of the 8 input signal lines. However, it may still be possible to employ this particular shift register latch as part of a logic circuit output latching mechanism so that the shift register latch position is not entirely wasted. However, it is noted that this may not always be possible and that there may indeed be some need to employ dummy shift register latches. Nonetheless, the number of such dummy latches is minimal when the present invention is optimally practiced.

With respect to shift register latch 9, it is seen that this must be assigned to input signal line 5 which is the only row in FIG. 2F which has not been marked or assigned. In this way, it is seen that by following the three steps specified above, it is always possible to provide an assignment linking shift register latch outputs to input signal lines in such a way that adjacent shift register latches do not provide signals to the same cones of logic. It is also in this way that the advantages of the present invention are achieved.

Figure 3A:
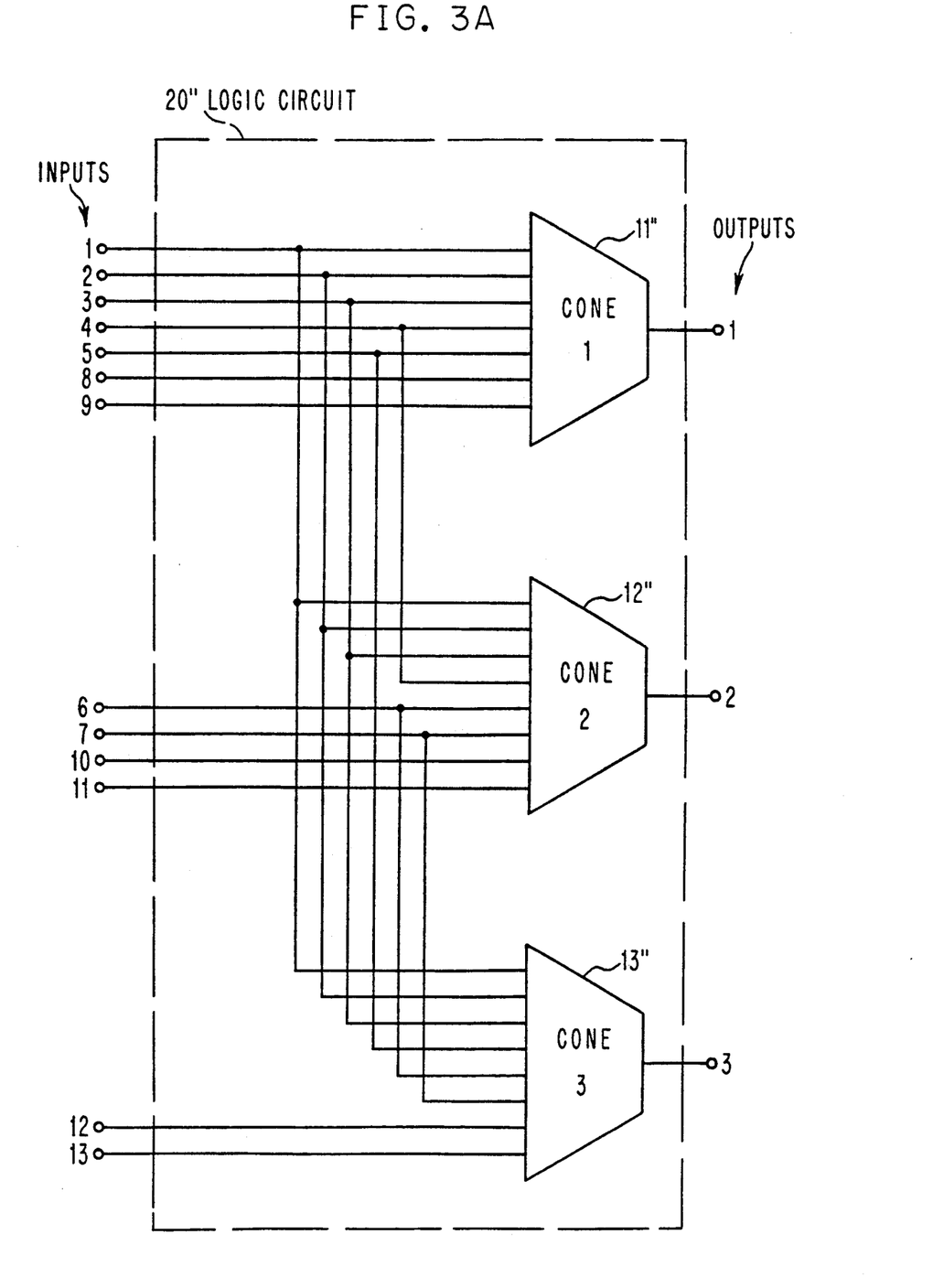
FIG. 3A is another exemplary logic circuit more explicitly laid out in terms of existing cones of logic.
Figure 3B:
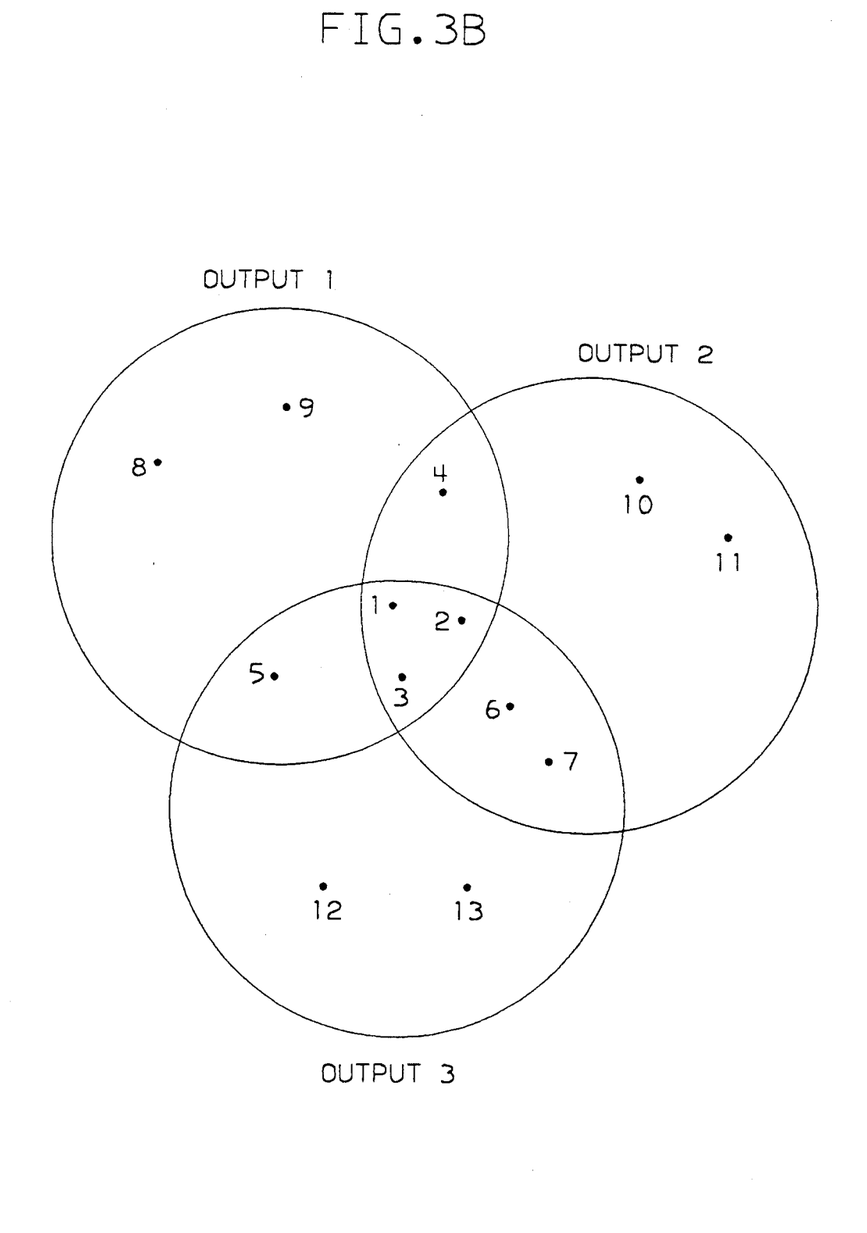
FIG. 3B is a Venn diagram similar to FIG. 2E but more particularly directed to the circuit shown in FIG. 3A.
Figure 3C:
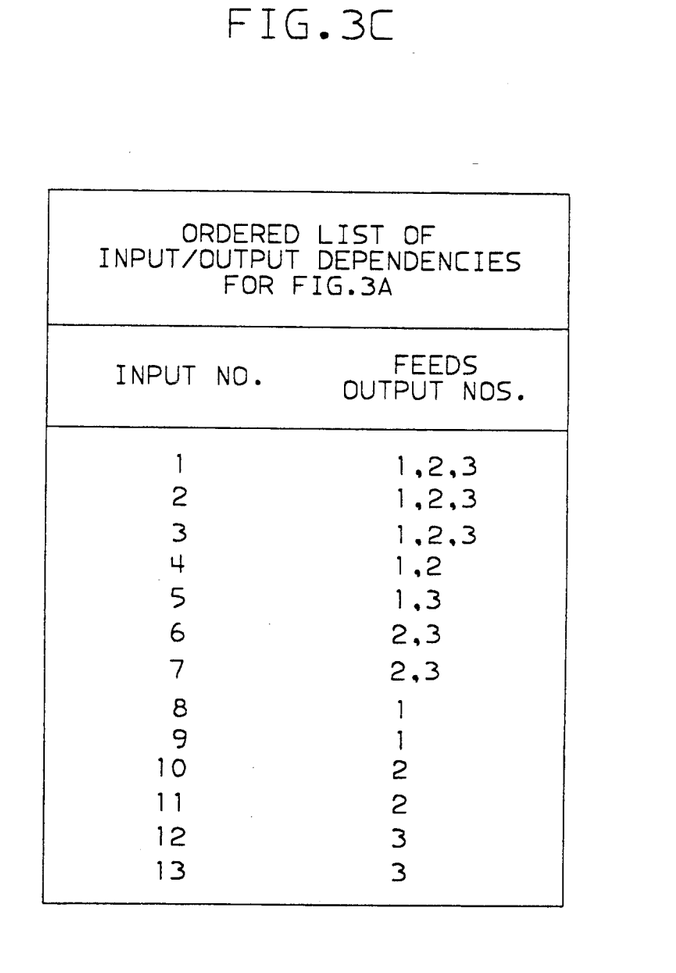
FIG. 3C is an ordered list of input/output associations for the circuit shown in FIG. 3A.

As a further illustration of the application of the distribution assignment method of the present invention, a second exemplary logic circuit is shown in FIG. 3A. It is noted however that FIG. 3A, a schematic diagram, is drawn in such a way as to combine the information content laid out in the previously shown example in FIGS. 2A through 2D. In this particular case, it is seen that input signal lines 1 through 13 feed three different cones of logic 11'', 12'' and 13'' which comprise logic circuit 20' and which has output signal lines 1, 2 and 3. The Venn diagram for the logic circuit shown in FIG. 3A, which is analogous to FIG. 2E, is shown in FIG. 3B. In particular, in this case it is seen that there are in fact three input signal lines, namely lines 1, 2 and 3 which do indeed feed all three cones of logic. Such input signal lines are the ones that naturally appear at the top of the ordered list described above. In particular, this ordered list is shown in FIG. 3C. Naturally, those input signal lines which feed only two cones of logic (here input signal lines 4, 5, 6 and 7) are shown next in the ordered list. Lastly, those input signal lines feeding only one cone of logic are listed. While it may be harder to draw Venn diagram illustrations for cases where there are four or more cones of logic, the ordering arrangement is still described by the method shown above. In particular, it is seen that the ordered list that is developed could in fact be grouped into blocks of rows with the lowest most block having input signal line numbers feeding only one cone of logic with the next highest block including those that feed two cones of logic and the next higher block with those feeding three cones of logic, etc.

Figure 3D:
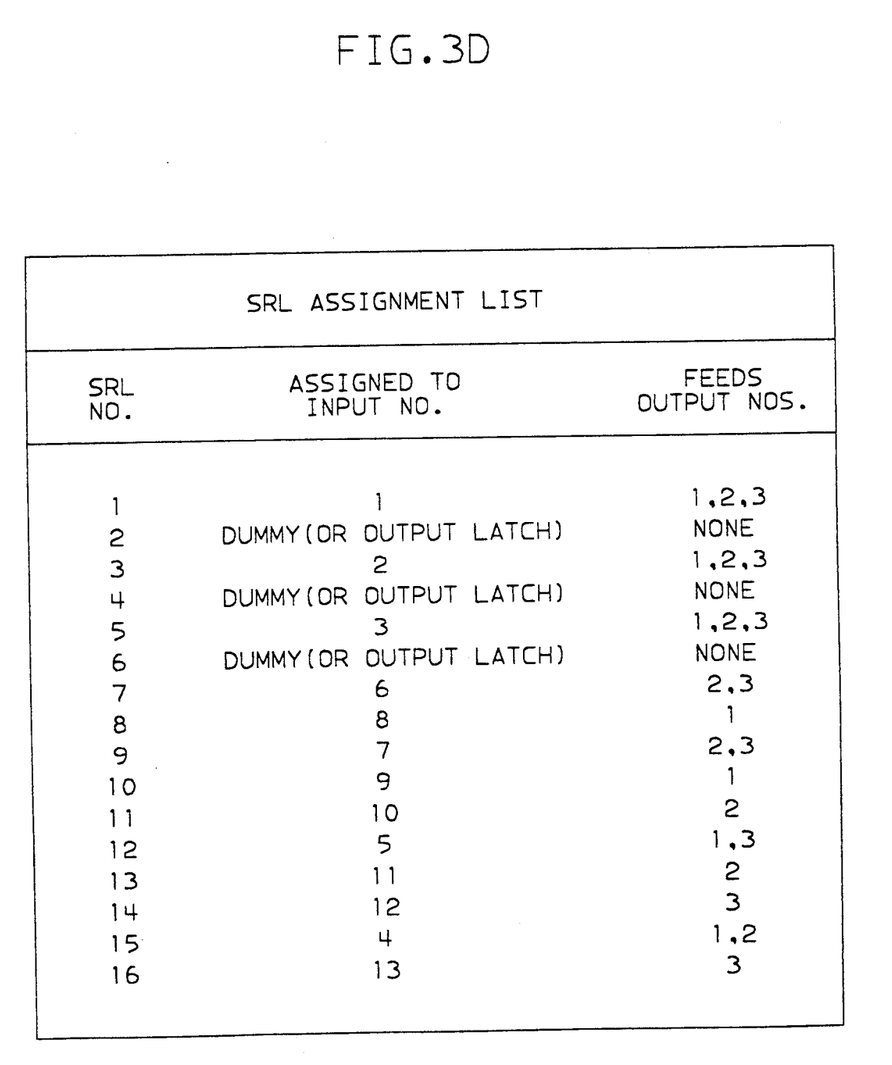
FIG. 3D is a list of shift register latch output assignments made in accordance with the present invention for the circuit shown in FIG. 3A.

If the above method is applied to the list shown in FIG. 3C, the shift register assignment list is that which is shown in FIG. 3D. In particular, this assignment list associates the outputs of shift register latches 1 through 16 with various input signal lines. Additionally, a third column is provided which shows which cones of logic are fed by the corresponding shift register latch. In particular, it should be noted that as one scans down the third column in FIG. 3D, no shift register latch assignment is made so that latches which are adjacent in the list feed the same cone of logic. It is this property which provides the test advantages described above.

It should also be noted that with respect to shift register latches 2, 4 and 6, it is necessary to provide dummy shift register latches because it is not possible to make an assignment for adjacent latches where there is no overlap, since in the case of input signal lines 1, 2 and 3, it is seen that they do indeed feed all of the three possible cones of logic, and it is therefore not possible to make the desired configuration without employing dummy latches (which may be utilized as output latches).

Figure 3E:
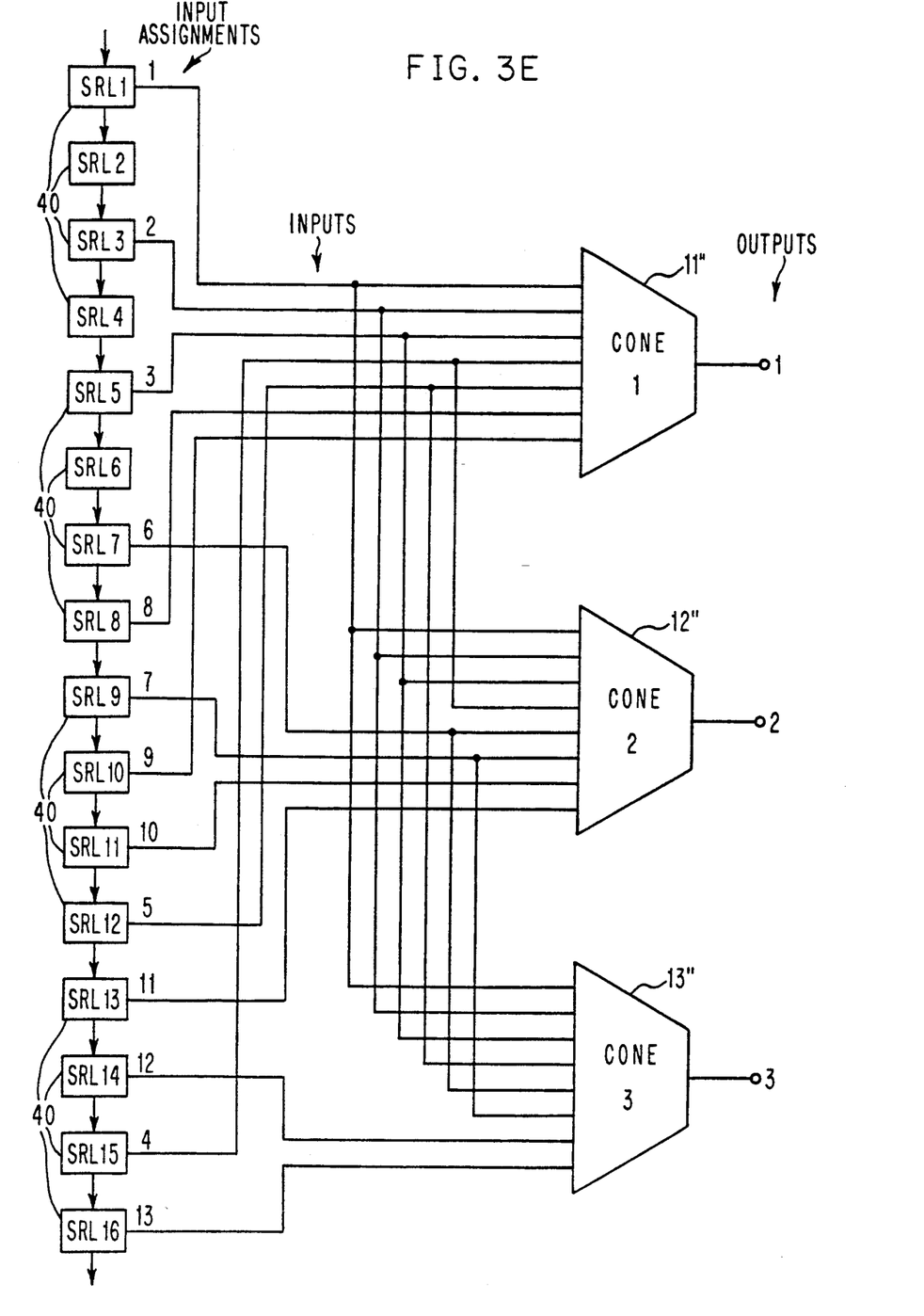
FIG. 3E is a logical block diagram illustrating the distribution of shift register latch output signal line assignments made in accordance with the present invention for the circuit of FIG. 3A.

The resultant combination of scan string and logic circuit arrangement, resulting from the assignment shown in FIG. 3D, is the circuit shown in FIG. 3E. It is also noted that since there are three output latch assignments that should be made for the three output signal lines. The assignment of dummy latches can be completed by making the corresponding assignments to the outputs without inducing any latch overhead at all. However, it is noted that this fortuitous example may not always be illustrative of the necessary assignments to dummy latches. Nonetheless, the method does provide significant advantages including all of the test advantages indicated above without introducing significant overhead in the number of shift register latches actually employed to achieve the objective.

Accordingly, from the above, it should be appreciated that by providing a judicious assignment of shift register output signal lines to logic circuit input signal lines which are associated with various cones of logic, it is possible to provide a circuit arrangement in which, without the excessive use shift register latches and the consumption of corresponding chip real estate, it is possible to significantly increase the number of test patterns that may be applied to a given cone of logic during delay testing.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

We claim:

1. A combination of a logic circuit and test means comprising:

a logic circuit having a plurality of input signal lines and a plurality of output signal lines each of said output signal lines being associated with a cone of logic which includes certain ones of said input signal lines; and a chain of shift register latches providing input signals to said logic circuit input signal lines, wherein a number of adjacent latches provide signals to different cones of logic, said number of latches being greater than the number of said cones of logic associated with said output signal lines less one.

2. The combination of claim 1 in which at least one dummy shift register latch is employed so that adjacent latches provide signals to different cones of logic.

3. The combination of claim 2 in which adjacent latches provide signals to different cones of logic entirely through the use of dummy shift register latches.

4. A combination of a logic circuit and test means comprising:

a logic circuit having a plurality of input signal lines and a plurality of output signal lines each of said output signal lines being associated with a cone of logic which includes certain ones of said input signal lines;

a chain of shift register latches providing input signals to said logic circuit input signal lines, wherein a number of adjacent latches provide signals to different cones of logic, said number of latches being greater than the number of said cones of logic associated with said output signal lines less one; and a chain of shift register latches providing input signals to said logic circuit, wherein no two adjacent latches provide signals to the same cone of logic.

* * * * *